United States Patent
Mohanty et al.

(10) Patent No.: US 8,063,535 B2
(45) Date of Patent: Nov. 22, 2011

(54) NANOMECHANICAL OSCILLATOR

(75) Inventors: Pritiraj Mohanty, Boston, MA (US); Alexei Gaidarzhy, Allston, MA (US); Guiti Zolfagharkhani, Allston, MA (US); Robert L. Badzey, Quincy, MA (US)

(73) Assignee: Trustees of Boston University, Boston, MA (US)

( * ) Notice: Subject to any disclaimer, the term of this patent is extended or adjusted under 35 U.S.C. 154(b) by 620 days.

(21) Appl. No.: 11/813,342

(22) PCT Filed: Jan. 4, 2006

(86) PCT No.: PCT/US2006/000401
§ 371 (c)(1),
(2), (4) Date: Nov. 13, 2008

(87) PCT Pub. No.: WO2006/083482
PCT Pub. Date: Aug. 10, 2006

(65) Prior Publication Data
US 2009/0294638 A1    Dec. 3, 2009

Related U.S. Application Data

(60) Provisional application No. 60/642,400, filed on Jan. 7, 2005.

(51) Int. Cl.
*H01L 41/08*    (2006.01)

(52) U.S. Cl. ........ 310/321; 310/330; 310/331; 333/187; 333/195

(58) Field of Classification Search .................. 310/309, 310/321, 322, 367, 368; 331/116 M, 116 V, 331/156; 333/187
See application file for complete search history.

(56) References Cited

U.S. PATENT DOCUMENTS

| 3,634,787 | A | * | 1/1972 | Newell ........................... 333/186 |
| 5,640,133 | A | * | 6/1997 | MacDonald et al. .......... 333/197 |
| 5,751,200 | A | * | 5/1998 | Yamashita et al. ............ 333/197 |
| 5,914,553 | A |   | 6/1999 | Adams et al. |
| 6,041,600 | A |   | 3/2000 | Silverbrook |
| 6,124,765 | A |   | 9/2000 | Chan et al. |

(Continued)

FOREIGN PATENT DOCUMENTS
WO    WO 98/01948 A1    1/1998
(Continued)

OTHER PUBLICATIONS

Gaidarzhy, A., "Spectral response of a gigahertz-range nanomechanical oscillator," *App. Phys. Lett.* 86, 254103-1, 2005 American Inst. of Physics.

(Continued)

*Primary Examiner* — Mark Budd
(74) *Attorney, Agent, or Firm* — Wolf, Greenfield & Sacks, P.C.

(57) ABSTRACT

A mechanical oscillator has components with dimensions in a sub-micron range to produce resonance mode oscillations in a gigahertz range. A major element is coupled to a minor, sub-micron element to produce large amplitude gigahertz frequency oscillation that is detected with readily available techniques. The mechanical structure can be formed according to a number of geometries including beams and rings and is excited with electrostatic, magnetic and thermal related forces, as well as other excitation techniques. The mechanical structure can be arranged in arrays for applications such as amplification and mixing and is less sensitive to shock and radiative environments than electrical or optical counterparts.

24 Claims, 8 Drawing Sheets

U.S. PATENT DOCUMENTS

| | | | |
|---|---|---|---|
| 6,223,601 B1 * | 5/2001 | Harada et al. .................. | 73/649 |
| 6,249,073 B1 | 6/2001 | Nguyen et al. | |
| 6,424,074 B2 | 7/2002 | Nguyen | |
| 6,577,040 B2 | 6/2003 | Nguyen | |
| 6,593,831 B2 | 7/2003 | Nguyen | |
| 6,600,252 B2 | 7/2003 | Nguyen | |
| 6,680,660 B2 | 1/2004 | Nguyen | |
| 6,710,680 B2 | 3/2004 | Niu et al. | |
| 6,713,938 B2 * | 3/2004 | Nguyen ...................... | 310/309 |
| 6,737,939 B2 | 5/2004 | Hoppe et al. | |
| 6,739,190 B2 | 5/2004 | Hsu et al. | |
| 6,763,340 B1 | 7/2004 | Burns et al. | |
| 6,831,531 B1 | 12/2004 | Giousouf et al. | |
| 6,859,113 B2 | 2/2005 | Giousouf et al. | |
| 6,861,914 B2 | 3/2005 | Photiadis et al. | |
| 6,909,221 B2 | 6/2005 | Ayazi et al. | |
| 6,917,138 B2 * | 7/2005 | Nguyen ...................... | 310/311 |
| 6,930,569 B2 | 8/2005 | Hsu | |
| 6,943,484 B2 | 9/2005 | Clark et al. | |
| 6,947,719 B2 | 9/2005 | Buchaillot et al. | |
| 6,954,020 B2 | 10/2005 | Ma et al. | |
| 6,995,622 B2 | 2/2006 | Partridge et al. | |
| 7,005,946 B2 | 2/2006 | Duwel et al. | |
| 7,211,926 B2 | 5/2007 | Quevy et al. | |
| 7,215,061 B2 | 5/2007 | Kihara et al. | |
| 7,248,128 B2 | 7/2007 | Mattila et al. | |
| 7,352,608 B2 | 4/2008 | Mohanty et al. | |
| 7,492,241 B2 | 2/2009 | Piazza et al. | |
| 7,504,909 B2 | 3/2009 | Tada | |
| 7,724,103 B2 | 5/2010 | Feng et al. | |
| 7,755,454 B2 * | 7/2010 | Tanaka et al. ................ | 333/186 |
| 7,791,432 B2 | 9/2010 | Piazza et al. | |
| 2002/0113191 A1 | 8/2002 | Rolt et al. | |
| 2003/0117237 A1 * | 6/2003 | Niu et al. ..................... | 333/187 |
| 2003/0186672 A1 | 10/2003 | Buchaillot et al. | |
| 2004/0061564 A1 * | 4/2004 | Photiadis et al. ............. | 331/156 |
| 2004/0113722 A1 | 6/2004 | Bircumshaw et al. | |
| 2004/0207492 A1 | 10/2004 | Nguyen et al. | |
| 2005/0073078 A1 | 4/2005 | Lutz et al. | |
| 2005/0158905 A1 | 7/2005 | Kubena et al. | |
| 2006/0186971 A1 | 8/2006 | Lutz et al. | |
| 2007/0247245 A1 | 10/2007 | Hagelin | |
| 2008/0143217 A1 | 6/2008 | Ho et al. | |
| 2008/0204153 A1 | 8/2008 | Yoshida et al. | |
| 2008/0272852 A1 | 11/2008 | Six | |
| 2009/0108381 A1 | 4/2009 | Buchwalter et al. | |
| 2009/0108959 A1 | 4/2009 | Piazza et al. | |
| 2009/0144963 A1 | 6/2009 | Piazza et al. | |
| 2009/0294638 A1 | 12/2009 | Mohanty et al. | |
| 2010/0007443 A1 | 1/2010 | Mohanty et al. | |
| 2010/0134207 A1 | 6/2010 | Mohanty et al. | |
| 2010/0155883 A1 | 6/2010 | Wenzler et al. | |

FOREIGN PATENT DOCUMENTS

| | | |
|---|---|---|
| WO | WO 98/37635 A1 | 8/1998 |
| WO | WO 2004/027796 | 4/2004 |
| WO | WO 2005/029700 A1 | 3/2005 |
| WO | WO 2006/000611 A1 | 1/2006 |
| WO | WO 2006/083482 A2 | 8/2006 |
| WO | WO 2008/036845 A2 | 3/2008 |
| WO | WO 2010/011288 A1 | 1/2010 |

OTHER PUBLICATIONS

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

International Search Report and International Preliminary Report on Patentability for PCT/US2006/021298 mailed Nov. 6, 2006 and Dec. 6, 2007 respectively.

International Search Report and Written Opinion from PCT/US2007/079059 mailed Mar. 14, 2008.

International Search Report and Written Opinion from PCT/US2008/003793, mailed Jun. 16, 2008.

International Search Report and Written Opinion from PCT/US2007/079078, mailed Jul. 3, 2008.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

Shim et al., "Synchronized Oscillation in Coupled Nanomechanical Oscillators," Science 316:95-99, Apr. 6, 2007.

European Search Report from European Application No. 06733632.1, mailed May 6, 2009.

International Search Report, from PCT/US2006/000401, mailed Oct. 16, 2006.

Adams, S., et al., "Independent Tuning of Linear and Nonlinear Stiffness Coefficients", Journal of Microelectromechanical Systems, vol. 7, No. 2, Jun. 1, 1998, pp. 172-180.

Lee, S., et al., "Mechanically-Coupled Micromechanical Resonator Arrays for Improved Phase Noise", IEEE Frequency Control Symposium and Exposition, Proceedings 2004, Aug. 23, 2004, pp. 144-150.

Neuzil, P., et al., "Air flow actuation of micromechanical oscillators", Applied Physics Letters, vol. 79, No. 1, Jul. 2, 2001, pp. 138-140.

Nguyen, C., "Vibrating RF MEMS for Next Generation Wireless Applications", IEEE Custom Integrated Circuits Conference 2004, Oct. 3, 2004, pp. 257-264.

\* cited by examiner

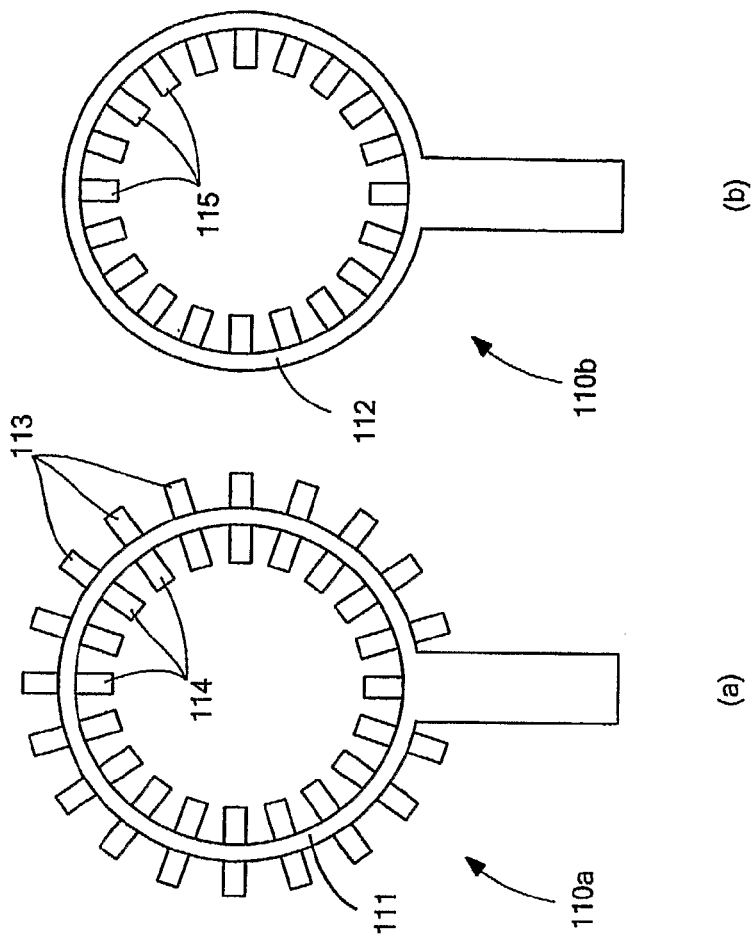
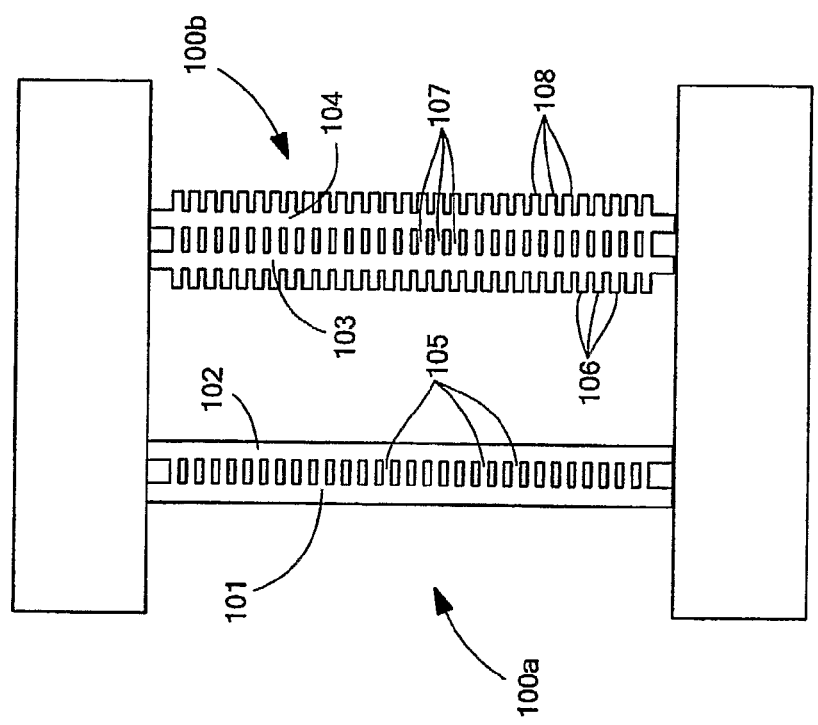
FIG. 11
FIG. 10

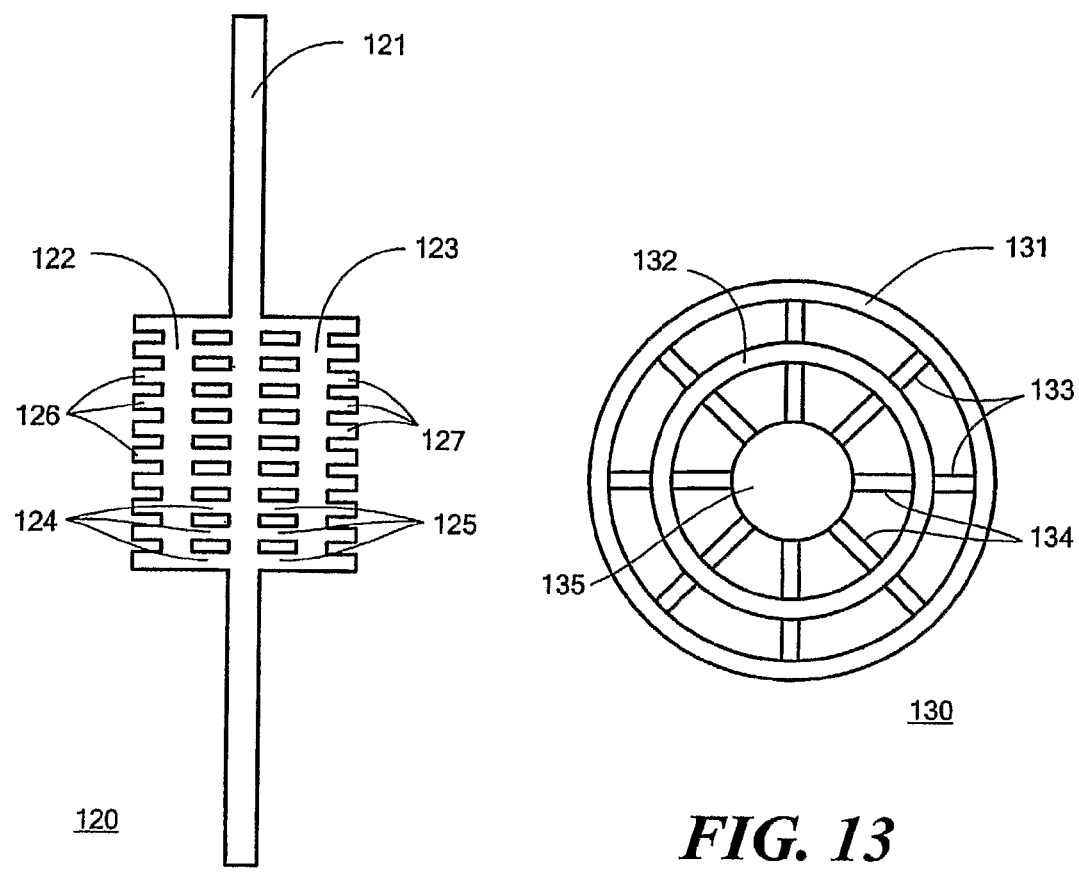
FIG. 12
FIG. 13
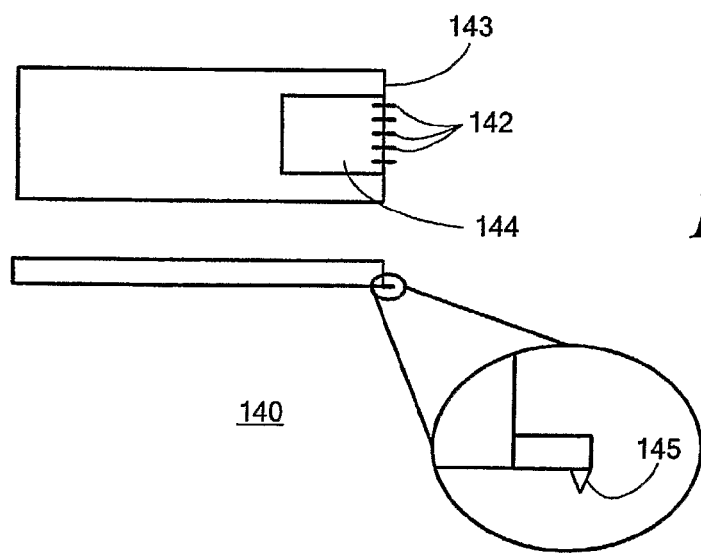
FIG. 14

NANOMECHANICAL OSCILLATOR

CROSS REFERENCE TO RELATED APPLICATIONS

This application claims the priority benefit of U.S. Provisional Patent Application No. 60/642,400, filed Jan. 7, 2005, entitled MULTI-ELEMENT NANOMECHANICAL OSCILLATOR, the whole of which is hereby incorporated herein by reference.

STATEMENT REGARDING FEDERALLY SPONSORED RESEARCH OR DEVELOPMENT

This invention was made with Government Support under Grant Number DMR-0346707 awarded by the National Science Foundation and Grant Number DAAD19-00-2-0004 awarded by the U.S. Army Research Office. The Government has certain rights in the invention.

BACKGROUND OF THE INVENTION

1. Field of the Invention

The present invention relates generally to small scale mechanical oscillators, and relates more particularly to nanoscale mechanical oscillators with several vibrational elements that permit a number of resonance modes.

2. Description of Related Art

Microelectromechanical and nanoelectromechanical systems, MEMS and NEMS, respectively, are fabricated typically with semiconductor technology as mechanical devices. Some of their advantages include good resistance to thermal shock, electromagnetic radiation, and impact shock. As with typical mechanical structures, MEMS and NEMS structures possess natural vibrational frequencies that are determined by their exterior dimensions. For example, it is well known that a simple doubly clamped beam structure has a fundamental transverse resonance frequency determined by the equation $$f = \sqrt{\frac{E}{\rho}} \frac{t}{L^2} \quad (1)$$

Where E is Young's modulus related to material stiffness, $\rho$ is material density, t is a thickness dimension parallel to displacement and L is the length of the beam. Devices with dimensions on the order of microns typically have resonance frequencies on the order of tens of kilohertz up to a few megahertz. Devices with dimensions on the order of sub-micron levels have proportionally higher resonance frequencies in the gigahertz range. The high resonance frequencies available from MEMS and NEMS devices, with associated fast switching times, have been used successfully in a number of applications including mechanical switches and memory elements, mass or inertial sensors and other frequency-selective elements such as filters, mixers and amplifiers.

While MEMS devices have enjoyed popularity in a number of applications and benefited from a widespread effort in research, NEMS devices have not found as great a utilization. One difficulty in effectively applying NEMS devices to a given problem is that that the signal magnitude derived from operation of a NEMS device can be difficult to detect and signal strength can be significantly smaller than the counterpart MEMS devices. Because NEMS devices operate in a gigahertz range of frequencies, the small-scale responses are typically characterized by diminished amplitudes and increasing dissipative effects that result in a loss of signal fidelity. The signal losses are the result of numerous phenomena and are often well known. For example, the dissipative effects are increased by a heightened sensitivity to surface or processing induced defects in the silicon structures. The surface to volume ratio of the devices is increased thus making the sensitivity to defects more pronounced, and sensitivity to clamping losses derived from beam mounting points is also increased. Accordingly, losses that were small or negligible in MEMS devices become significant in the smaller NEMS devices as sensitivity to dissipative effect increases. The decrease in system size also leads to an increase in the effective stiffness of the structure, resulting in extremely small displacements even in resonance mode. Larger structures can provide high-order harmonics to overcome some of the size dependent effects, but the amplitude of high-order harmonics decreases rapidly with increasing harmonic order.

The difficulties in applying NEMS devices to produce mechanical RF and high-speed structures, for example, are thus highly challenging. Materials that can be challenging to work with, such as silicon carbide and diamond, provide higher sound velocities based on the stiffness-density ratio $$\sqrt{\frac{E}{\rho}} \quad (2)$$

Other factors involved in providing a desired NEMS device include the length of the beam L, which should be on a sub-micron scale to obtain gigahertz frequency ranges. As the size of the oscillating beam decreases to the sub-micron scale, the relationship between elastic stiffness of the material and the structural dimensions results in difficult to detect femtometer-level displacements in the sub-micron structures.

Some techniques are available for detecting mechanical motion on the femtometer scale, such as coupling the resonator to an RF single electron transistor, or utilizing a SQUID sensor, a piezoelectric sensor or optical interferometry. These types of detection schemes typically have the object of enabling observation of quantum mechanical motion. However, the measurement sensitivity of the equipment at close to GHz frequencies in millikelvin temperatures continues to remain orders of magnitudes beyond the quantum mechanical signal size.

For example, observation of quantum behavior is governed by dissipation or energy relaxation of 1/Q. As structures become smaller, and thus stiffer, the spring constant k increases and the displacement at resonance, x=FQ\k decreases for a given amplitude of force F. Although it is desirable to obtain sub-micron scale mechanical devices to generate gigahertz range oscillations, it is also important to have a structure with relaxed characteristics to decrease the spring constant k to obtain a larger and detectable displacement. Simple gigahertz range beams produce small displacements at resonance that are very difficult to detect and it is difficult to de-couple the spring constant k from the beam natural frequency. The relationship between spring constant k and natural frequency produces signal dispersion influences that are difficult to overcome because the spring constant and the natural frequency are difficult to decouple. Accordingly, it is extremely difficult to realize a gigahertz frequency oscillator based on a vibratory structure, such as that of a beam.

SUMMARY

Briefly stated, in accordance with the present invention, there is provided a nanomechanical structure with a number of distinct vibrational elements suitable for resonance oscillation. The elements have a size and geometric relationship that permits a large number of resonant modes. The resonant modes include collective vibration in which the naturally high frequency of the minor elements is coupled to the naturally low spring constant of the major elements. The larger response produced by the contribution of the major elements is easily detected to obtain a mechanical oscillator operating in a gigahertz frequency range.

According to an exemplary embodiment, a beam-based structure is excited according to one or more excitation techniques to produce a high frequency oscillation that can be easily detected. The structure exhibits strong and definite resonance frequencies above 1 GHz, for example. One or more minor elements are coupled to the major beam-based structure, so that the combination of the vibrational outputs from the major and minor elements produces a relatively large displacement at resonance frequencies in the gigahertz range that can be easily detected.

According to another exemplary embodiment, a major element of the oscillator is in the micron range and consists of a doubly clamped suspended bridge structure or beam. One or more sub-micron range minor elements are coupled to the doubly clamped beam, for example, through mechanical coupling and are formed as cantilever beams. The natural frequencies of the sub-micron cantilever beams are at or near the desired oscillation frequency. According to an aspect of the present invention, the minor elements are arranged in arrays with a particular spacing to promote oscillation at a given frequency.

According to another exemplary embodiment, major and minor elements having different natural frequencies are coupled together to form a composite structure suitable for high frequency oscillation and frequency detection. According to an aspect of this embodiment, minor elements can be arranged in arrays to form a ladder-type geometry. The coupling of the major and minor elements is achieved according to a predetermined relationship, for example, an elastic relationship. The high-frequency resonance together with large amplitude response permits the composite structure to be used in a number of sophisticated and common applications. For example, the composite structure is mode selective, which is useful for filtering and mixing frequencies. The composite structure can also be designed to amplify high frequency resonance of the minor elements through the coupled major elements. Accordingly, applications in the telecommunications industry are plentiful.

According to another embodiment there is provided a composite structure with distinct normal modes that exhibit resonance at gigahertz frequencies, for example. Major and minor elements in the composite structure are specifically arranged to obtain operation at a particular normal mode. Modes of operation of the structures contemplated in accordance with the present invention may include torsional modes, dilatational modes, shear modes, rotational modes and longitudinal compression or relaxation modes. These types of composite structures are different from the doubly clamped beam structure described above, which exhibits a transverse mode of operation. In accordance with a particular aspect of the embodiment, an array of minor elements can be arranged to have a transverse mode, and be coupled to intermediate elements that produce a longitudinal mode. The intermediate elements can couple to the major elements to generate a torsional mode based on the longitudinal mode transmitted from the intermediate elements.

According to another aspect of the present invention, the composite structure is composed of a series of ring-shaped structures coupled to each other with compression-sensitive spring structures. The high frequency modes of the minor elements are coherently communicated to the major element.

According to another aspect of the present invention, the composite structure is configured to have a non-linear response to permit the generation of mixed-mode behavior. The mixed-mode behavior permits signal up and/or down conversion in which the structure converts a high frequency carrier signal to a lower frequency signal for processing and analysis, for example. The non-linear response illustrates the use of a mechanical element as an analog to non-linear elements of electrical RF components. The non-linear composite structures can be combined together to create an amplifier circuit with a tunable bandwidth, for example. The composite structure permits mixed mode behavior in relationship to the non-linear drive for the device. Accordingly, the composite structure may be tuned to have a particular mode-mixing characteristic to include or exclude certain frequencies of bands of frequencies.

According to another exemplary embodiment of the present invention, the composite structure has a non-linear response to generate a bi-stable or multi-stable states for the structure, based on the given drive signal. Accordingly, the composite structure may be used as a mechanical memory element, a mass sensor or may be used in other applications that utilize bi-stability or multi-stability in a sensor device.

In accordance with another exemplary embodiment of the present invention, resonance frequencies of the composite structure are shifted with the application of a suitable DC bias. The addition of a suitable DC bias produces additional strain on the composite structure, which results in a shift of the resonance frequencies. The application of the DC bias may be used to tune the characteristic resonances of the composite device to obtain predetermined frequency targets, for example.

The application of a DC bias may also be used to cause a band shift in the frequencies of the composite device. A band shift may be useful for switching between transmitting and receiving frequencies, for example, as well as to modulate the quality factor Q of the composite device within a desired bandwidth.

According to another exemplary embodiment of the present invention, the composite device is configured to have distinct operating qualities based on configurations related to size, frequency, or temperature. One of the distinct qualities available with the composite structures is quantum dynamical behavior, which permits the realization of a macroscopic quantum harmonic oscillator (MQHO). The frequency threshold for realizing an MQHO is approximately one gigahertz.

In accordance with an aspect of the present invention, the composite structures are operable at high frequency with large amplitude motion to permit the study and development of controllable devices for use as quantum bits or qubits, the basic unit of quantum information storage. The composite structures may be arranged in arrays where each of the qubits has the ability to occupy several different computational states at the same time. The several concurrent states enable massively parallel computing algorithms, cryptographic and anti-cryptographic schemes, as well as offering the possibility of study of quantum mechanical and dynamical systems in real time.

According to another exemplary embodiment of the present invention, the different elements provided in the composite structure can vary greatly in terms of dimensional scale. For example, composite structures may be formed that incorporate elements with dimensional scales ranging from sub-nanometer, i.e., <10⁻⁹ m to supra-millimeter, i.e., >10⁻³ m meters. The collective motion of the minor elements determines the resonance frequencies, which can be in the gigahertz or terahertz scale range. The collective motion of the composite structure elements provides displacements that are readily detectable through basic measurement techniques. The elements, their arrangement and size determines the band of frequencies in which the composite device operates.

According to another exemplary embodiment of the present invention, a number of composite structures are arranged in an array for utilization in a particular application. The array can be incoherent, in which each composite structure is substantially independent. Alternately, or in addition, the array of composite structures can be configured to be a phased array collection in which each constituent composite structure forms an intermediate element of a greater composite structure. The coupling of the different composite structures in the array can be achieved according to a number of techniques, such as, for example, mechanical, electrical, electromagnetic or optical. The precise placement of each constituent composite structure permits a resonance signal to be communicated coherently from one composite structure to another in the array. Different types of composite structures may be used in the array so that the communicated resonance signal may be modified or modulated among the different composite structures. Advantageously, adjoining composite structures in the array have some frequency range overlap. An input signal may be transmitted coherently through the phased array, and may be manipulated by the elements of the phased array. For example, the phased array may perform an up/down conversion of an incoming signal in relation to a carrier signal.

According to an aspect of the present invention, the elements of the composite structure may be formed according to a number of different geometries, either in whole or in part. Such geometries may include cantilevers, free-free bridges, free-clamped bridges, clamped-clamped bridges, disks, rings, prisms, cylinders, tubes, spheres, shells, springs, polygons, diaphragms and tori, for example. The composite structure may be driven through an excitation to a resonance mode frequency through techniques including electrostatic force, piezoelectric strain, magnetic attraction, magnetomotive force and thermal expansion and contraction. The detection of vibration in the composite structure may be achieved by a number of techniques, including through electrostatic force, piezoelectric strain, piezoresistive strain, magnetic attraction, magnetomotive force, thermal expansion and contraction and optical techniques.

BRIEF DESCRIPTION OF THE DRAWINGS

The present invention is described in greater detail below, with reference to the accompanying drawings, in which:

FIG. 10 is a plan view of two multi-element structures according to an exemplary embodiment of the present invention;

FIG. 11 is a plan view of two composite structure ring geometries according to an exemplary embodiment of the present invention;

FIG. 12 is a plan view of composite structure geometry with intermediate elements according to an exemplary embodiment of the present invention;

FIG. 13 is a plan view of composite structure geometry according to another exemplary embodiment of the present invention;

FIG. 14 is a diagram of a probe for use in microscopy applications in accordance with the present invention;

DETAILED DESCRIPTION OF THE PREFERRED EMBODIMENTS

The present invention provides a mechanical oscillator with nanoscale components that permit vibration frequencies in the gigahertz and terahertz ranges. The nanoscale elements are part of a composite structure that can have elements on a larger scale, such as micrometer or millimeter scale. The nanoscale elements are coupled to the larger scale elements through an elastic mechanical coupling, for example. Excitation of the oscillator may be achieved according to a number of different techniques, including mechanical, electrostatic, electrical, electromagnetic, magnetomotive, piezoelectric and thermal expansion or contraction. The composite structure may have many different geometries for both major and minor elements, and several variations are discussed below for particular qualities. It should be apparent, however, that the present invention contemplates a wide variety of geometries to achieve the purpose of the present invention in producing a mechanical oscillator with nanoscale elements to generate vibrational frequency in the range of gigahertz to terahertz.

Figure 1:
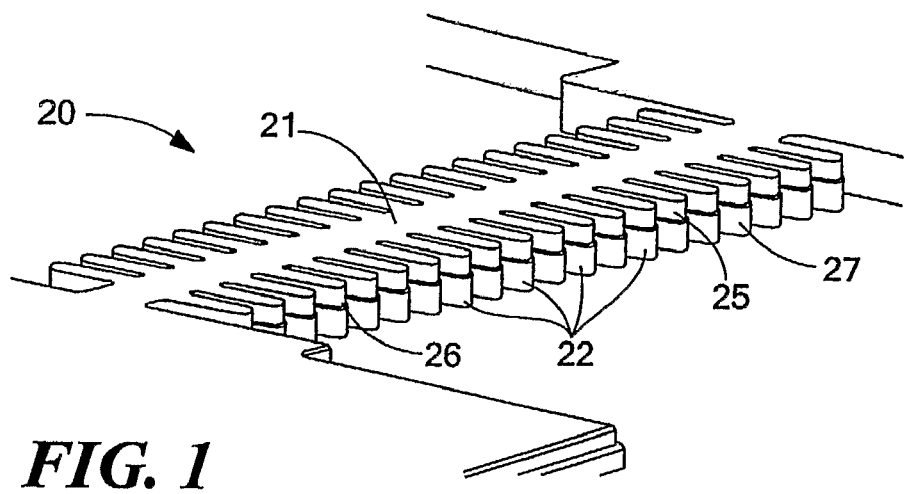
FIG. 1 is a micrograph of an embodiment of the present invention.
Figure 2:
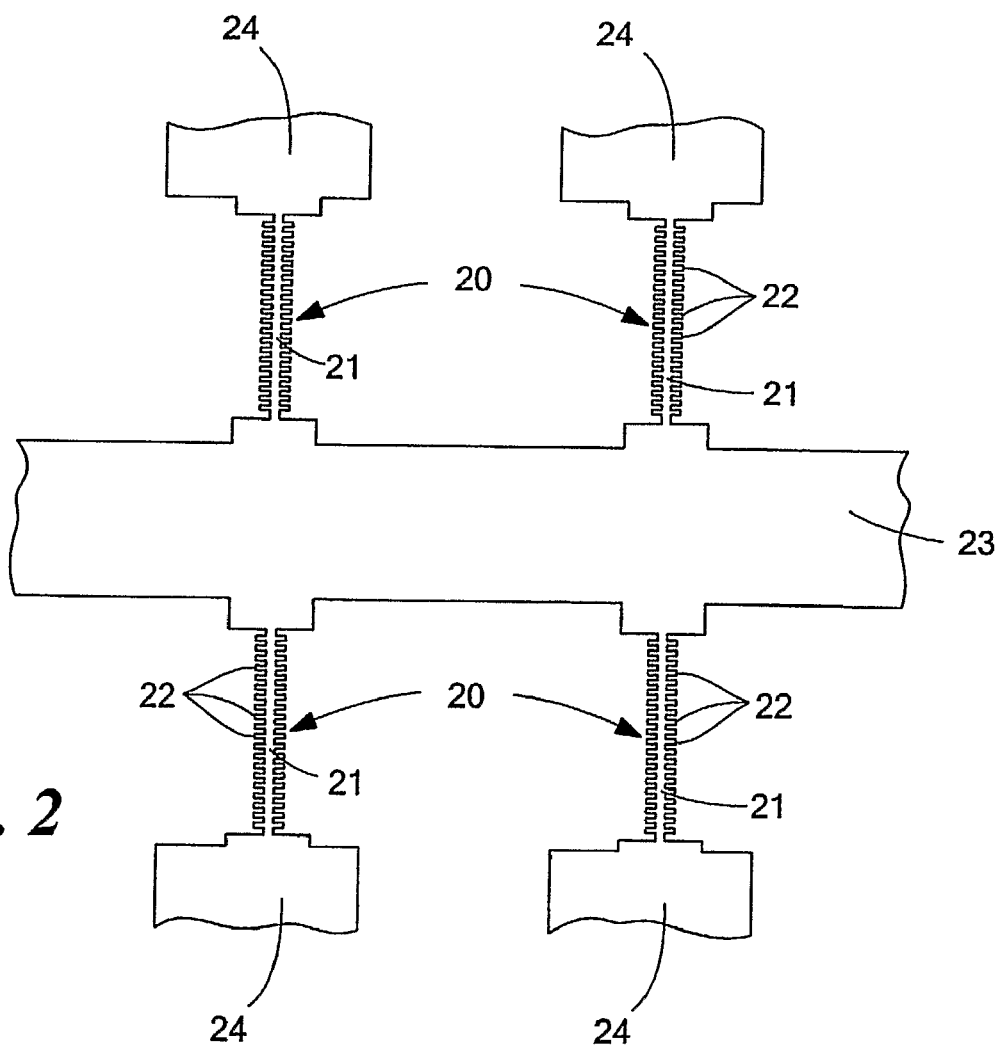
FIG. 2 is a micrograph of a collection of composite structures in a two-dimensional array.
Figure 3:
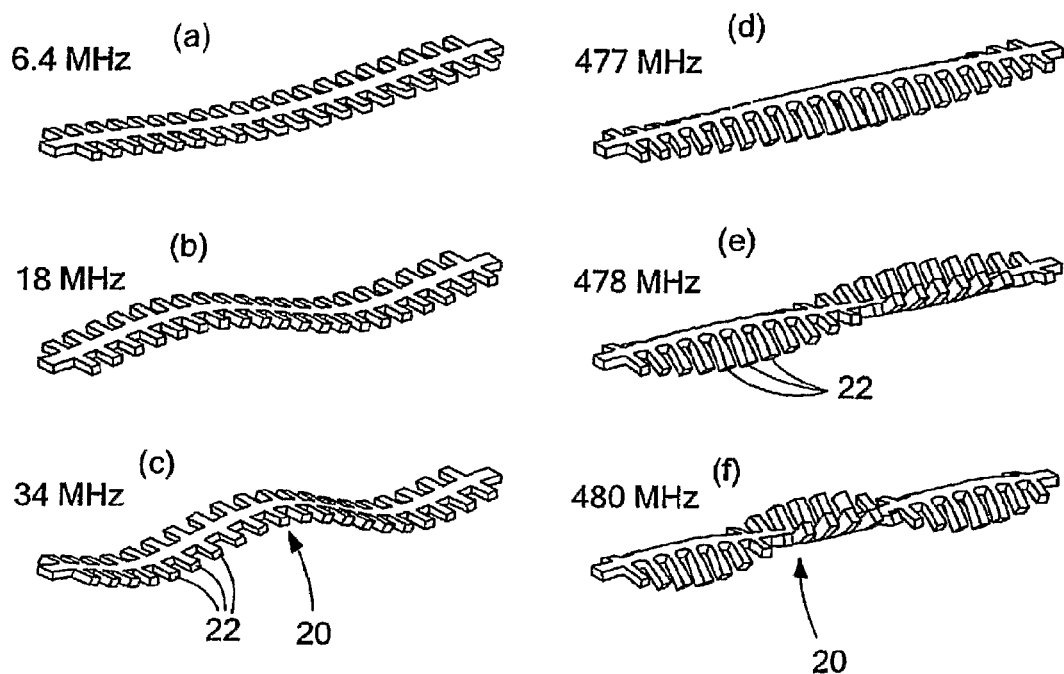
FIGS. 3a-f are perspective views of a composite structure simulation driven at different frequencies.

Referring now to FIGS. 1 and 2, a doubly clamped bridge structure 20 is illustrated with mechanically coupled cantilever beams 22. Composite structure 20 is composed of a major element in the form of doubly clamped beam 21 and minor elements in the form of cantilever beams 22. When composite structure 20 is exposed to an excitation source to drive oscillations in beam 21 and cantilevers 22, cantilevers 22 oscillate at a frequency much greater than that of beam 21.

Beam 21 has a dimension of approximately 10.7 µm by 400 nm by 250 nm. There are approximately 40 cantilevers 22 arranged as minor elements in a dual 20-element array on either side of beam 21. Cantilevers 20 have dimensions of approximately 500 nm by 250 nm by 250 nm. Composite structure 20 includes a gold electrode 25 as a top layer, which has a thickness of approximately 85 nm. Composite structure 20 also includes a thin 5 nm layer 26 composed of chromium interposed between gold electrode layer 25 and a silicon layer 27 to contribute to electrode adhesion between layer 25 and layer 27.

Composite structure 20 has a number of resonance frequencies where composite structure 20 operates in a resonance mode. Some of the resonance modes, herein referred to as collective modes, include contributions from cantilevers 22 in the form of phase locked oscillations. The phased locked oscillations influence beam 21 to create a resonant motion in beam 21 at a high frequency with large amplitude. The high frequency oscillation can be detected fairly easily because of the large amplitude seen in beam 21. The ability to detect high frequencies permits the mechanical oscillator to be advantageously utilized in a number of practical applications where high frequency oscillation is desired.

FIG. 2 illustrates an arrangement with an array of structures 20 coupled to a common electrode 23. Each structure 20 can be addressed individually through separate electrodes 24, or can be addressed communally through common electrode 23. Alternately, or in addition, electrode 23 may be composed of separate traces to permit each beam 20 to be isolated from the other. According to such an embodiment, each structure 20 can be addressed individually at different potentials, and with different DC offsets, for example. In addition, or alternately, one structure 20 can be joined in parallel or serially to another structure 20 to permit structures 20 to act as circuit components in a larger circuit. In addition, or alternately, one or more structures 20 can be particularly tuned for specific characteristics such as particular resonance frequencies.

Referring now to FIGS. 3a-f, various modes of vibration for a structure 20 are illustrated in a finite element simulation. The calculated resonance frequencies for each of the illustrated modes is indicated for each structure 20. The simulation illustrations for oscillating frequencies above 400 MHz demonstrate phase locked oscillation of the minor elements, cantilevers 22. The phase locked oscillation of cantilevers 22 contributes to providing the high frequency, high amplitude motion of beam 21, the major element, for detection of resonance frequency.

Figure 4:
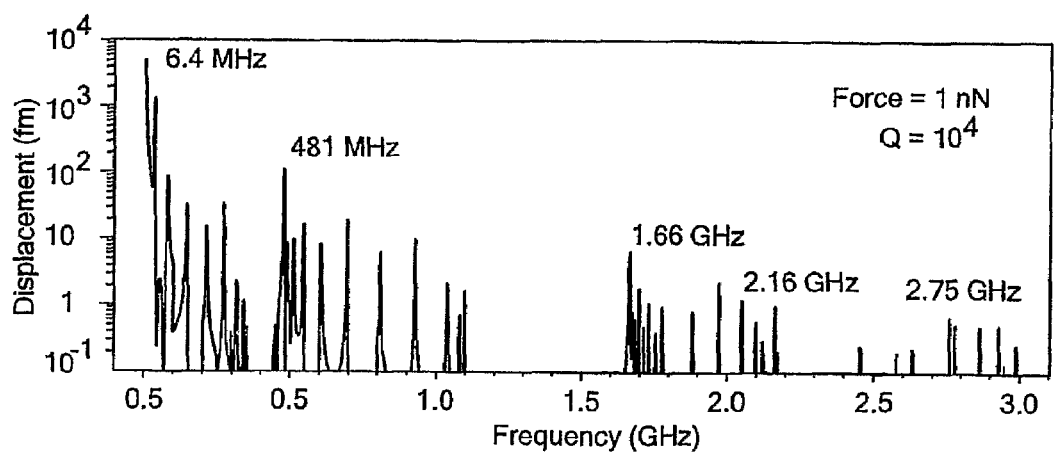
FIG. 4 is a graph of a calculated frequency response spectrum for a composite structure in accordance with the present invention.

Referring now to FIG. 4, a graph 40 of a calculated frequency response spectrum is illustrated. The calculations resulting in graph 40 are derived from a finite element simulation, as illustrated in FIGS. 3a-f. As can be seen in the higher frequency range of graph 40, a number of high order resonance modes of significant amplitude are available for frequency generation. The spectrum of frequencies also illustrates a grouping phenomena, in which different families of resonance modes are observed.

Figure 5:
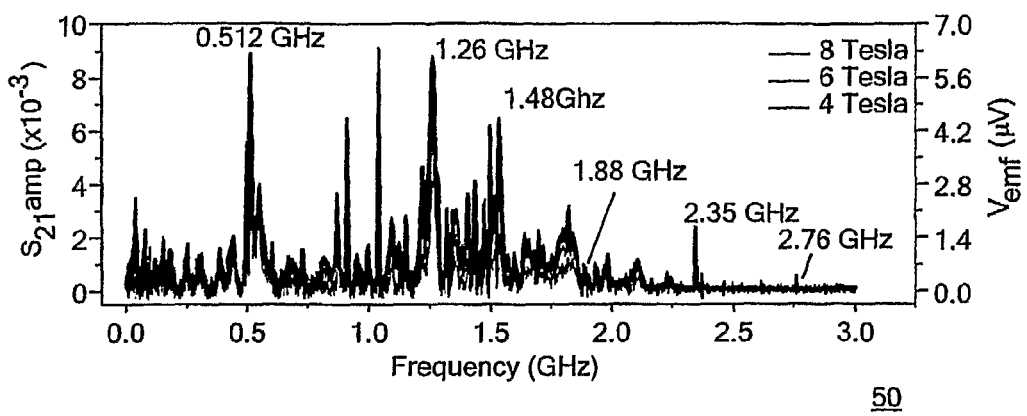
FIG. 5 is a graph of a measured frequency response spectrum for a composite structure in accordance with the present invention.

Referring now to FIG. 5, a graph 50 of a measured frequency response spectrum based on a composite structure 20 with a beam/cantilever structure is illustrated. Graph 50 illustrates a number of strong resonance peaks at frequencies that compare closely with those obtained in the finite element simulation. An interesting aspect of the high frequency peaks observed in the resonance modes at 1.88 GHz and 2.35 GHz is their closeness to active frequencies for digital cellular and wireless communications.

Figure 6:
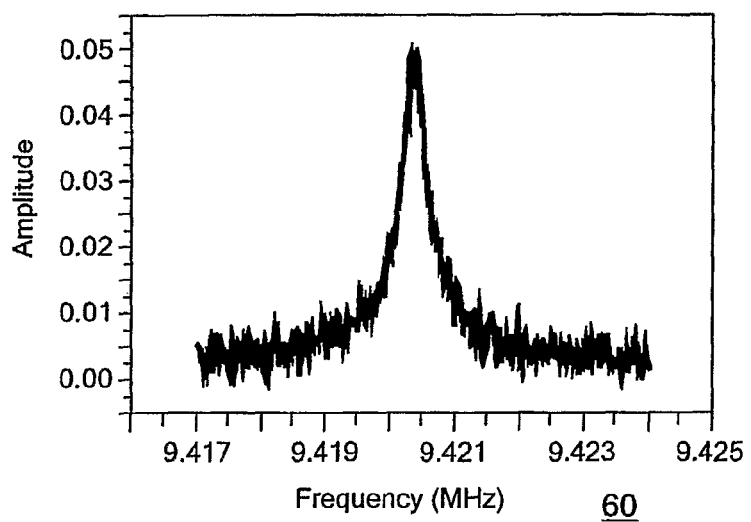
FIG. 6 is a graph of a measured frequency response of a composite structure in accordance with the present invention.

Referring now to FIG. 6, a graph 60 illustrates a strong resonance frequency peak at approximately 9.4 MHz for a composite bridge/cantilever structure, such as illustrated in FIG. 1. The peak at the relatively low frequency of 9.4 MHz corresponds to the excitation of the fundamental transverse vibrational mode of the major element, beam 21, with an additional impact related to mass loading due to the presence of minor array elements, cantilevers 22.

Figure 7:
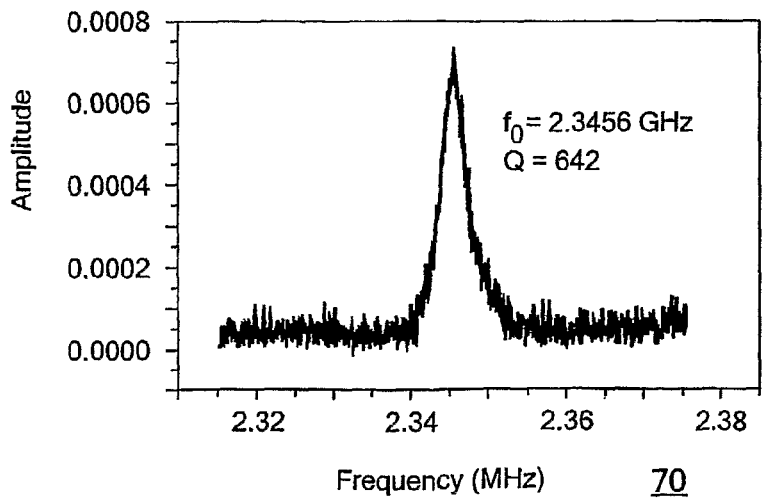
FIG. 7 is a graph of a measured frequency response of a composite structure according to the present invention.

Referring now to FIG. 7, a graph 70 illustrates a measured frequency response for the composite bridge/cantilever structure of FIG. 1 at a high frequency of approximately 2.3456 GHz. A higher frequency derived from the motion of composite structure 20 is a result of vibrational excitation of a high order collective mode in which beam 21 and cantilevers 22 cooperate to attain an overall resonance mode. As noted above, the resonance frequency peak illustrated in graph 70 is close to the wireless communication standard frequency of 2.4 GHz, so that the present invention is readily applicable to the telecommunications industry.

Figure 8:
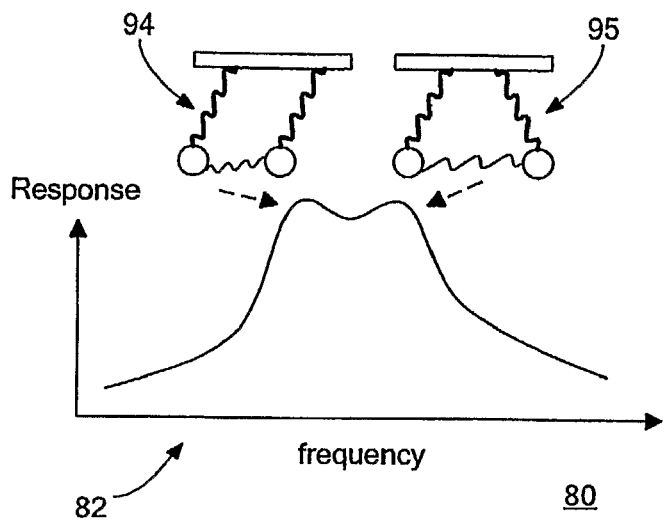
FIG. 8 is a diagram illustrating a relationship between different modes of a composite structure configured as a band pass filter.
Figure 9A:
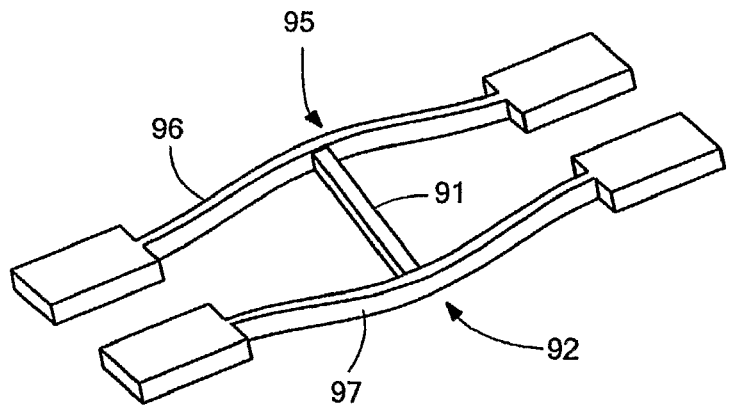
FIGS. 9a-b are perspective views of several simulations of a non-linear composite structure in accordance with the present invention.
Figure 9B:
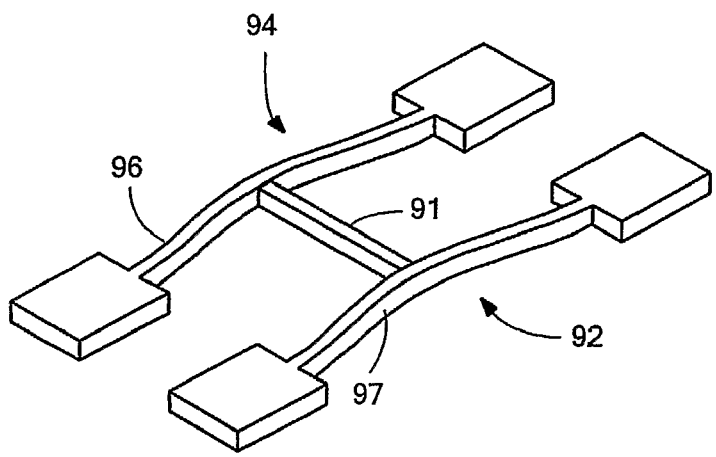

Referring now to FIGS. 8 and 9a-b, a diagram 80 illustrates a relationship between symmetric and anti-symmetric modes of the coupled oscillator structure 92. The coupled oscillator structure can be tuned to create a bandpass filter, as illustrated in graph 82 of diagram 80. FIGS. 9a-b illustrate doubly clamped coupled beams 92 joined with a flexible bridge 91. FIG. 9a represents an anti-symmetric mode 95 in which doubly clamped beams 96, 97 are oscillating out of phase with each other. FIG. 9b represents a symmetric oscillation mode 94 in which doubly clamped coupled beams 96, 97 oscillate in phase with each other. The two different modes, symmetric mode 94 and anti-symmetric mode 95, represent frequency ranges in combination that can be tuned by adjustment of the dimensions of the composite structure 92, as well as the spring constant of bridge 91. The frequencies of symmetric mode 94 and anti-symmetric mode 95 can also be tuned with the addition of particularly characterized bridges to enable the design and placement of band pass frequencies. Accordingly, a single structure with a ladder type geometry can be used to produce a device that can amplify higher resonance modes generated through the collective motion of major and minor elements in a gigahertz oscillator. The relative proximity of the symmetric and anti-symmetric modes in the frequency domain establishes an effective bandpass filter. The shape of the passband can be modified with the addition of major and/or minor element arrays to obtain, for example, a flatter passband and more effective filter. The coupling, or intermediate elements, such as bridge 91, tend to mediate the interaction between the major and minor elements to permit an increase in signal fidelity amplification and response. The coupling or intermediate elements also demonstrate mechanical mixing, in which the major elements generate sum and difference signals from an input at two or more different frequencies. The precise coupling of major and minor elements in a predetermined relationship provide a unique method for designing filters and mixers with nanoscale devices operating in a gigahertz range with high precision and repeatability.

Referring now to FIG. 10, structures 100a and 100b have a ladder type geometry with doubly clamped beams 101-104 and minor elements 105-108. Minor elements 105-108 are in the form of an array coupling major elements 101-104 in a particular geometry, such as, for example, a ladder type geometry. Structures 100a and 100b have unique frequency response spectrums due to the coupling of major elements 101-104 with minor elements 105 and 107, respectively. In this respect, minor elements 105 and 107 can be considered intermediate elements that communicate vibration information between major elements 101-104. The lack of cantilevers for structure 100a produces a significantly different frequency response compared to structure 100b, with cantilevers 106 and 108. As discussed above, the major and minor elements of structures 100a and 100b can be tailored to provide particular frequency response spectrums and produce symmetric and anti-symmetric modes of resonance. The symmetric and anti-symmetric modes of resonance can be exploited to form high frequency bandpass filters.

Referring now to FIG. 11, an alternate geometry is illustrated as structure 110a and 110b, with major elements 111, 112 in the form of rings. An array of high frequency cantilevers 113-115 is disposed as minor elements around rings 111, 112 to contribute to producing collective modes of oscillation. Structures 110a, 110b form ring resonators with collective transverse vibrations from cantilevers 113-115 that generate a high frequency response in the major ring elements 111, 112. The high frequency response resulting from the transverse vibrations can be derived from torsional, flexural, dilatational or any other type of normal mode response permitted by ring structures 111, 112.

Series of ring structures such as ring structures 110a, 110b can be coupled together with, for example, compression-sensitive spring structures. With such a coupling, high frequency modes of minor elements can be coherently communicated to major elements and coupled structures. As described above, the coupled structures can exhibit a non-linear response in which symmetrical and anti-symmetrical modes of resonance to generate particular frequency spectrums for use in amplifying, filtering or mixing, for example.

Referring now to FIG. 12, another geometry for a composite structure 120 is illustrated. Composite structure 120 illustrates the use of elements having more than one scale size to form an oscillator with particular frequency characteristics. Composite structure 120 includes freely suspended beams 122, 123, supported by bridge elements 124, 125, respectively. Cantilevers 126, 127 are joined to beams 122, 123, which act as intermediate elements for coupling a particular oscillation response to main doubly clamped beam 121. Composite structure 120 thus exhibits particular frequency characteristics that can be tailored based on the dimensions of the major and minor elements, as well as the characteristics of intermediate elements such as beams 122, 123 or bridges 124, 125.

Referring now to FIG. 13, another geometry for a composite structure 130 is illustrated. Composite structure 130 is formed with elements of different scale sizes and different vibrational mode shapes. Rings 131 and 132 act as major elements in composite structure 130, while spokes 133, 134 couple rings 131, 132 to each other, and also to a central hub 135 formed as a larger scale element. Composite structure 130 provides a number of vibrational modes, including combinations of longitudinal, transverse, flexural, dilatational, rotational and torsional modes. Again, the components of composite structure 130 may be designed to have a non-linear response and produce symmetrical and asymmetrical modes for use in amplifying, filtering and mixing applications, as well as to particular frequency ranges.

Referring now to FIG. 14, a diagram 140 of a scanning probe microscopy (SPM) tip incorporating a composite structure in accordance with the present invention is illustrated. Composite structures 142 are positioned at an end 143 of a rigid support 144, to which composite structures 142 are coupled for recovery of topology and other information during a scan of a surface. An atomically sharp tip 145 is coupled to composite structures 142. As tip 145 is brought into close proximity with a surface under study, the relevant forces such as atomic, magnetic, and so forth, cause tip 145 to deflect. Composite structure 142 is excited at a collective mode resonance frequency and can recover the deflection information based on frequency changes. Composite structures 142 are raster scanned across a sample surface under study, so that nanosecond scan speeds become possible. This technique may be applied in atomic force microscopy (AFM) and magnetic force microscopy (MFM). Support 144 operates like a tuning fork that scans over the surface to be studied while tip 145 is fractions of a nanometer away from the surface under study. The deflections in tip 145 are used to map the surface, which can be achieved at high speeds due to the simplicity and direct applicability of the composite structure oscillators provided in accordance with the present invention. Previous variations of SPM devices and technologies used to tuning fork devices with resonance frequencies in the kilohertz range. Composite structures 142 in accordance with the present invention contribute to creating a tuning fork structure where the vibrational support for atomic tip 145 is provided by composite structures 142. Because the resulting tuning fork structure can operate in a gigahertz range, scanning speeds can be many orders of magnitude faster than those presently available.

Figure 15:
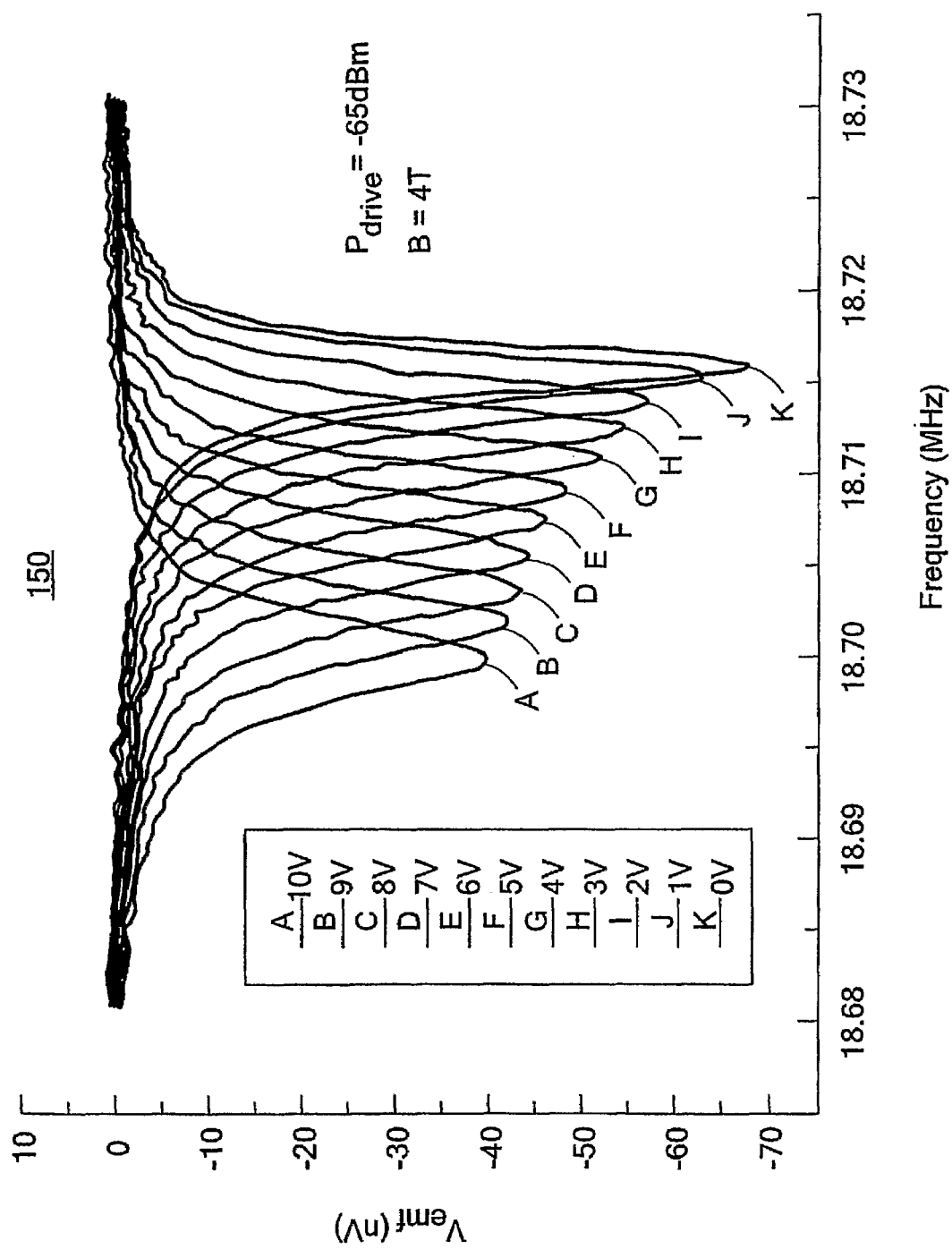
FIG. 15 is a graph illustrating the effects of an application of a DC bias on the resonance frequency of a composite structure in accordance with the present invention.

Referring now to FIG. 15, a graph 150 illustrates the impact on resonance frequency of an applied DC voltage. As can be seen from graph 150, a DC bias applied to a composite structure according to the present invention tends to shift the resonance frequency in a particular direction and to a particular degree. The frequency response curves illustrated in graph 150 are derived from a simple doubly clamped beam as a composite structure. However, the same effect of an applied DC bias is obtained on varieties of composite structure geometries, to enable a controllable tuning of a resonance frequency mode over a wide range of frequencies. The application of an appropriately sized DC bias provides an additional strain on the composite structure, which causes the resonance frequency to shift accordingly. The resonance frequencies of the composite structure can thus be tuned to correspond with predetermined frequency targets.

The application or removal of a DC bias can be used to shift to the device from transmitting to receiving frequencies, for example. In addition, or alternatively, the application of a DC bias may be used to modulate a quality factor of the device within a desired bandwidth. For example, the magnitude and polarity of an applied DC bias may be used to dynamically tune an oscillating composite structure to follow a given frequency with a high degree of precision. As another example, the DC bias may be used to modulate a quality factor of a device within a desired bandwidth.

Figure 16:
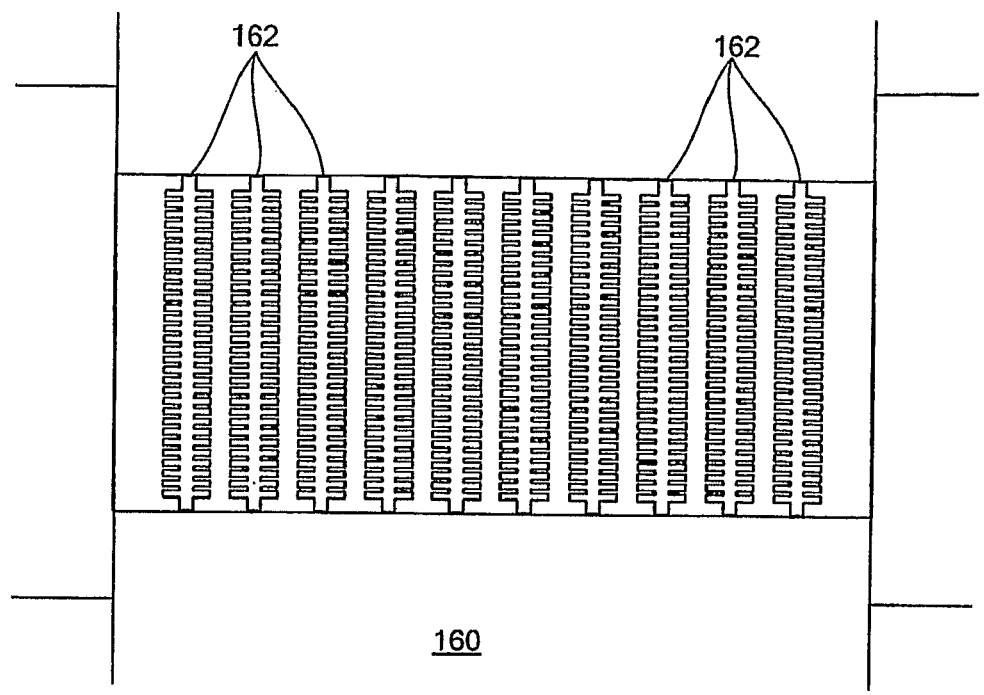
FIG. 16 is a plan view of an array of composite structures according to an exemplary embodiment of the present invention.

Referring now to FIG. 16, in array 160 of composite structures 162 is illustrated. Composite structures 162 may be independent, or may be arranged to operate in unison, for example in a phase or anti-phase mode. When one or more composite structures 162 are independent, they are independently accessed, excited and measured. If one or more composite structures 162 are coordinated, a relationship between composite structures 162 permits a coordinated or synchronized operation in which composite structures 162 depend upon the operation and characteristics of the corresponding related composite structures 162. For example, in a phased array, composite structures 162 have a particular separation and coupling between each other so that actions or phenomena experienced on composite structure 162 are communicated to adjoining composite structures 162. The phased array effectively causes each constituent composite structure 162 to act as an intermediate element of a greater composite structure, such as array 160. The constituent composite structures 162 are effectively coupled together to communicate vibrational information through the array. The coupling of composite structures 162 may be mechanical, electrical, electromagnetic or capacitive, for example. The array may be constructed to generate, filter, receive or amplify signals such as electrical, electromagnetic or optical signals. The precise placement of constituent composite structures 162 permits a resonant signal from each composite structure 162 to be communicated coherently to an adjoining composite structure 162 to propagate a signal at a given frequency or range of frequencies. Composite structures 162 in array 160 need not be identical, and typically have a frequency overlap to transmit a signal through the array, potentially through different frequencies. For example, a phased array may be used to transmit a signal, or perform an up or down conversion on an incoming signal to produce a carrier signal, or vice versa.

Figure 17:
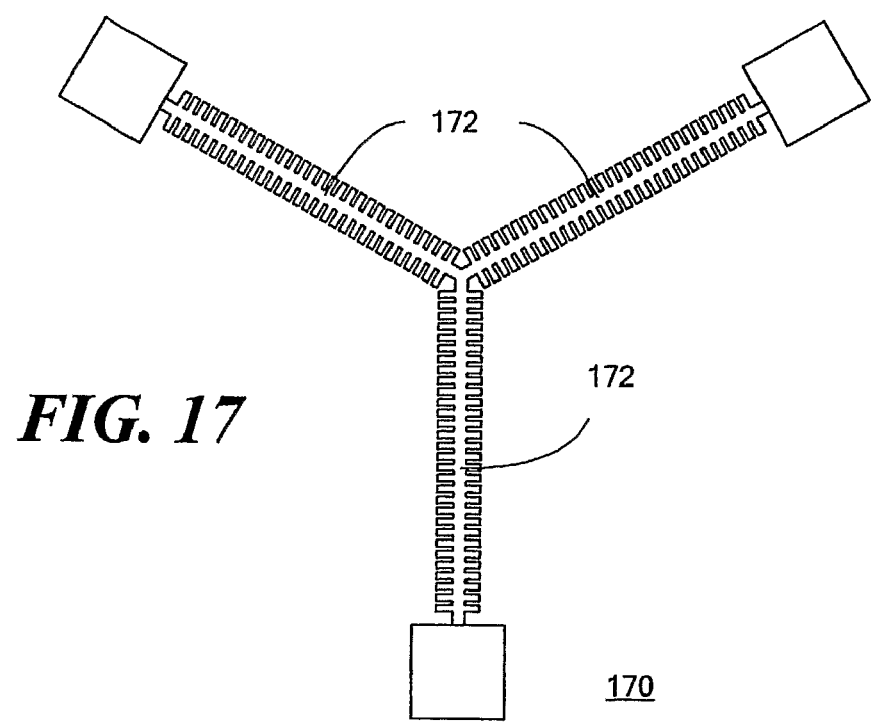
FIG. 17 is a plan view of an array of composite structures according to another exemplary embodiment of the present invention.

Referring now to FIG. 17, another embodiment of a phased array 170 is illustrated. Array 170 includes major elements in the form of beams 172. Beams 172 are anchored at one end, while commonly joined at another end. With the construction according to array 170, vibrations from oscillations in any one of composite structures 172 are communicated to the other composite structures 172, and vice versa. Array 170 is more sensitive to external stimuli and can be produced proportionally stronger carrier signals, for example. It should be apparent that the arrays of composite structures are not be limited to a single type of structure, direction or plane, but can be constructed to have active pathways in multiple directions for communicating signals or responding to external stimuli.

The device in accordance with the present invention may be fabricated according to a number of techniques taken from the semiconductor industry, including silicon on insulator (SOI). The composite structure can be defined through lithographic techniques using an electron beam source. Photolithography can also be used to obtain the appropriate precision and desired device dimensions, especially if more recent deep-UV source and mask technology is used. Structure definition and release of the structure are accomplished in accordance with an exemplary embodiment through reactive ion etching (RIE) and hydrofluoric acid (HF) wet etch and critical point drying. These fabrication steps are established within the semiconductor industry, so that the device in accordance with the present invention may be constructed readily and without great expense. Materials used for fabricating the device in accordance with the present invention include pure metals, metallic alloys, alternative semiconductor compositions such as silicon carbide (SiC), diamond, metal/semiconductor compounds or combinations of the above. Quartz or other related materials may also be used for piezoelectric actuation and detection.

The dimensions of a composite structure like that illustrated in FIG. 1, when composed of silicon, is approximately 10.7 μm long and 400 nm wide in an exemplary embodiment. Arrays of cantilevers on either side of the central beam have dimensions of 500 nm for length and 200 nm for width, while the thickness of the entire structure is approximately 245 nm. The device includes a layer of silicon with a thickness of approximately 185 nm and a layer of thermally evaporated gold serving as an electrode with a thickness of approximately 60 nm.

There are a number of applications for the device in accordance with the present invention, a few of which are discussed below. One instance where the device according the present invention is readily applicable is for an RF router or switch. Another application is directed to receiving a carrier signal and absorbing or processing the signal, and readmitting the signal in one or more directions. The device according to the present invention has a very small size and high fidelity, so that a massive number of devices can be used together to generate reliable communication signals in a very confined space. Because the device is mechanical in nature, the invention is suitable for space communication devices, which are typically subjected to large amounts of physical and radiative stress during their useful lifetimes. Devices that do not rely on the electrical properties of components, such as a mechanical device in accordance with the present invention, are typically more resilient to thermal, electromagnetic, radiation and acceleration shock.

Another widespread application for the device in accordance with the present invention is for a read/write head for magnetic platter hard drives. The read/write speed for the hard drive is determined by the ability of the head to register changes in the magnetic domains on the surface of the platter. The device in accordance with present invention permits detection of the magnetic domains at a greatly increased speed to enable read/write speeds that are significantly faster than present devices.

According to an embodiment of the present invention, the composite structure is forced into or designed to have a nonlinear response to generate a mixed mode behavior. The nonlinear composite structure demonstrates signal up or down conversion, where a high frequency carrier signal is converted to a signal of lower frequency for processing and analysis, or vice versa. While non linear elements have been used in electrical RF circuits to obtain up down conversion, the present invention provides a mechanical realization to produce the same result. The nonlinear composite structure is also suitable for use as an amplifier circuit with a tunable bandwidth. The degree to which modes are mixed is related to the nonlinear drive of the device, so that tuning the mode mixing to include or exclude certain frequencies or bands of frequencies is readily achieved.

A composite structure with a nonlinear response also permits operating conditions that exhibit bi-stability or multistability. Accordingly, the composite structures may be used as mechanical memory elements, mass sensors or other established implementations capitalizing on bi-stable modes. Bi-stability or multi-stability can be obtained in the collective modes, so that such an element can operate at frequencies above 1 GHz.

In accordance with the present invention, the composite structure may take the form of or be operated as an antenna like device. That is, the composite structure is sensitive to or able to generate certain frequencies or frequency ranges in accordance with established antenna design criteria. Accordingly, the composite structure may take the shape of any type of known antenna, such as those described and illustrated above.

The composite structure has the ability to demonstrate quantum dynamical behavior under certain conditions related to size, frequency or temperature. For example, a basic goal in realizing a so-called macroscopic quantum harmonic oscillator (MQHO) is establishing a resonant frequency such that the energy within each mode hf is comparable to or less than the thermal energy of the device $k_B T$. Here, h is Planck's constant, f is the resonant frequency, $k_B$ is the Boltzmann constant, and T is the temperature. For a temperature of 48 mK, this threshold is reached when the frequency is 1 GHz. With the high frequency, large amplitude motion permitted by the composite structures in accordance with the present invention, it is possible to develop controllable devices that can be used as quantum bits ("qubits"), a basic unit of quantum information storage. Arrays of qubits have the ability to occupy several different computational states at one time, enabling massively parallel computing algorithms, exceptional cryptographic and anti-cryptographic schemes, and the ability to study quantum mechanical and dynamical systems in real time.

Excitation of the composite structures according to the present may be achieved through a number of different techniques, including electrostatic force, piezoelectric strain, magnetic attraction, magnetomotive force and thermal driven expansion and contraction. Techniques for sensing vibrational amplitude of the oscillator may involve electrostatic force, piezoelectric strain, piezoresistive strain, magnetic attraction, magnetomotive force, thermal driven expansion and contraction and optical techniques. Depending upon the shape of the composite structures, vibrational resonance can take the form of torsional, transverse, shear, longitudinal compression or tension, dilatational, rotational or flexural modes. The composite structures may be composed of materials such as silicon, diamond, quartz, gallium arsenide (GaAs), gallium nitride (GaN), silicon carbide (SiC), silicon nitride (SiN), pure metals, bimetallic strips, heterogeneous semiconductor and metal compositions and heterogeneous compositions of two or more semiconductor materials. The geometry of the composite structures include any antenna type geometry, as well as cantilevers, free-free bridges, free-clamped bridges, clamped-clamped bridges, discs, rings, prisms, cylinders, tubes, spheres, shells, springs, polygons, diaphragms and tori. Any of the major, minor or intermediate elements may be composed either in whole or in part of the same or different geometries. In addition, several different type geometrical composite structures may be coupled together to obtain particular resonance mode responses.

It will further be appreciated by those of ordinary skill in the art that modifications to and variations of the above-described switching systems may be made without departing from the inventive concepts disclosed herein. Accordingly, the invention should not be viewed as limited except as by the scope and spirit of the appended claims.

What is claimed is:

1. A mechanical oscillator, comprising:
a major element forming a first vibrational structure;
a support coupled to the major element for suspending the major element to permit the major element to oscillate;
a minor element coupled to the major element to form a second vibrational structure, the minor element having an overall large dimension in a sub-micron range; and
an intermediate element interposed between the major and minor elements,
wherein the mechanical oscillator is configured to exhibit a collective resonance mode oscillation frequency achieved through cooperation of the major and minor elements when excited to vibrate.

2. The oscillator according to claim 1, wherein the collective resonance mode oscillation frequency has a supra-megahertz frequency.

3. The oscillator according to claim 1, further comprising another support for suspending the major element, wherein the major element is a doubly clamped beam.

4. The oscillator according to claim 1, wherein the minor element is a cantilever beam elastically coupled to the major element.

5. The oscillator according to claim 3, wherein the minor element is a cantilever beam elastically coupled to the doubly clamped beam.

6. The oscillator according to claim 1, further comprising an electrode coupled to one or more of the major element or minor element and operable to communicate a signal generated by oscillation of the oscillator.

7. The oscillator according to claim 6, wherein the electrode permits communication of an electrical signal generated by oscillation of the oscillator.

8. The oscillator according to claim 1, further comprising a material and an arrangement of the material in the oscillator suitable for contributing to enabling excitation of the oscillator, wherein the excitation is selected from the group consisting of electrocapacitive, optical, piezoelectric, piezoresistive, magnetomotive and magnetic excitation.

9. The oscillator according to claim 1, wherein the oscillator is composed of a material selected from the group consisting of silicon, diamond, quartz, GaAs, GaN, SiC, SiN, pure metals, bimetallic strips, heterogeneous semiconductor and metal compositions, heterogeneous compositions of a plurality of semiconductor material, or combinations of the above.

10. The oscillator according to claim 1, further comprising a plurality of major elements.

11. The oscillator according to claim 1, wherein a portion of the major element further comprises a geometry selected from the group consisting of cantilevers, free-free bridges, free-clamped bridges, clamped-clamped bridges, discs, rings, prisms, cylinders, tubes, spheres, shells, springs, polygons, diaphragms and tori.

12. The oscillator according to claim 1, wherein a portion of the minor element further comprises a geometry selected from the group consisting of cantilevers, free-free bridges, free-clamped bridges, clamped-clamped bridges, discs, rings, prisms, cylinders, tubes, spheres, shells, springs, polygons, diaphragms and tori.

13. The oscillator according to claim 1, wherein a portion of the intermediate element further comprises a geometry selected from the group consisting of cantilevers, free-free bridges, free-clamped bridges, clamped-clamped bridges, discs, rings, prisms, cylinders, tubes, spheres, shells, springs, polygons, diaphragms and tori.

14. A circuit including a number of inter-coupled components, wherein one or more of the components is the oscillator according to claim 1.

15. The circuit according to claim 14, wherein the circuit is a type selected from the group consisting of electrical, mechanical, magnetic, optical and electromechanical.

16. An array of oscillators, wherein one or more is the oscillator according to claim 1.

17. The array according to claim 16, wherein the oscillators are interrelated to form a phased array.

18. The oscillator according to claim 1, further comprising a DC bias source coupled to the oscillator for applying a DC bias to the oscillator.

19. The oscillator according to claim 7, further comprising an AC current source coupled to the oscillator for applying an AC current to the electrode.

20. The oscillator according to claim 18, further configured to exhibit a shifted collective resonance mode oscillation frequency when a DC bias is applied from the DC bias source.

21. The oscillator according to claim 1, further comprising an arrangement of the major and minor elements to obtain a non-linear response when the oscillator is excited under predetermined conditions.

22. The oscillator according to claim 1, further comprising an arrangement of the major and minor elements to produce a multi-stable response when the oscillator is excited under predetermined conditions.

23. The oscillator according to claim 1, wherein the collective resonance mode oscillation frequency is in the range of from about 1 kHz to about 1 THz.

24. A scanning probe microscopy device for sensing characteristics of a scanned surface, comprising a probe tip coupled to a vibrational support, wherein the vibrational support is the oscillator according to claim 1.

* * * * *